United States Patent [19]

Berger et al.

[11] 4,255,676

[45] Mar. 10, 1981

[54] SEMICONDUCTOR PHASE SHIFT DEVICE FOR A CHARGE TRANSFER FILTER

[75] Inventors: Jean-Luc Berger; Jean-Louis Coutures, both of Paris, France

[73] Assignee: Thomson-CSF, Paris, France

[21] Appl. No.: 2,094

[22] Filed: Jan. 9, 1979

[30] Foreign Application Priority Data

Jan. 13, 1978 [FR] France .................. 78 00934

[51] Int. Cl.³ .................. H03K 5/135; H03K 5/15; H03K 5/05
[52] U.S. Cl. .................. 307/262; 307/269; 307/221 D; 307/481; 307/583
[58] Field of Search .................. 307/208, 262, 221 C, 307/269, 221 D, 251

[56] References Cited

U.S. PATENT DOCUMENTS

| | | | |
|---|---|---|---|
| 3,311,751 | 3/1967 | Maestre | 307/262 |
| 3,626,216 | 12/1971 | Bergman | 307/262 X |
| 3,641,370 | 2/1972 | Heimbigner | 307/269 |
| 3,955,100 | 5/1976 | Takahashi et al. | 307/208 X |
| 4,035,628 | 7/1977 | Lampe et al. | 307/221 D |
| 4,140,927 | 2/1979 | Feucht | 307/262 |
| 4,145,676 | 3/1979 | Benoit-Gonin et al. | 307/221 C |

*Primary Examiner*—John S. Heyman
*Attorney, Agent, or Firm*—Roland Plottel

[57] ABSTRACT

A phase shift circuit made from integrable semi-conductor elements. It comprises: a sampling stage formed by two MOS type transistors operating in phase opposition, which supply, from the input signal ($S_e$), a sampled signal $S_{ECH}$; a first MOS type transistor which forms the phase shift element, receives signal $S_{ECH}$ on its gate and delivers two signals ($S_1$ and $S_2$), which are opposite in phase, at its drain and source respectively; two capacitors, which receive signals $S_1$ and $S_2$ respectively, and are associated with polarizing means containing MOS type transistors, which enable the original D.C. components of signals $S_1$ and $S_2$ to be replaced by the same D.C. component ($V_P$).

10 Claims, 4 Drawing Figures

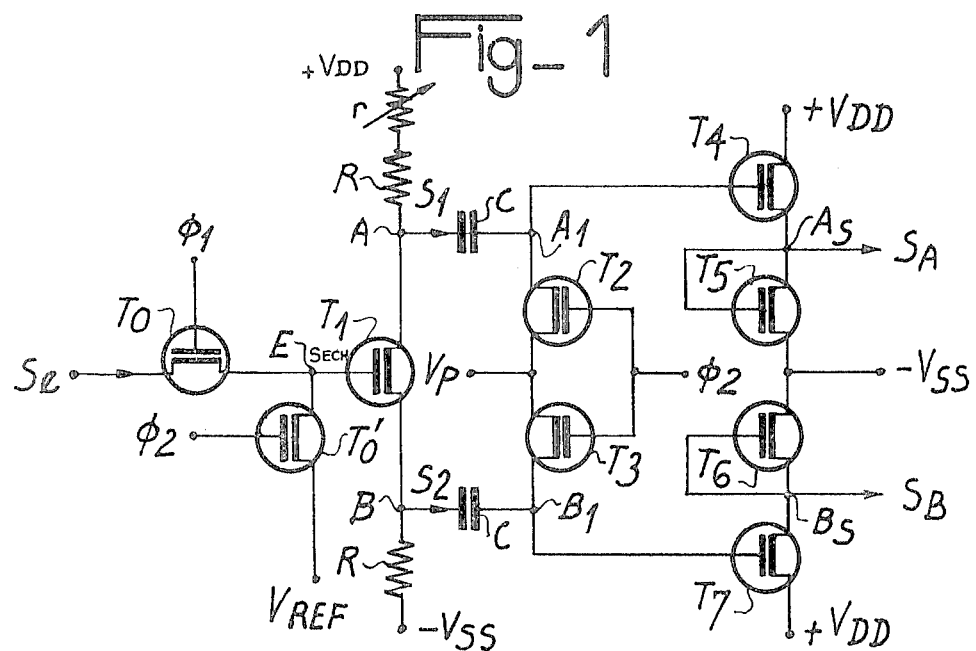
Fig_1
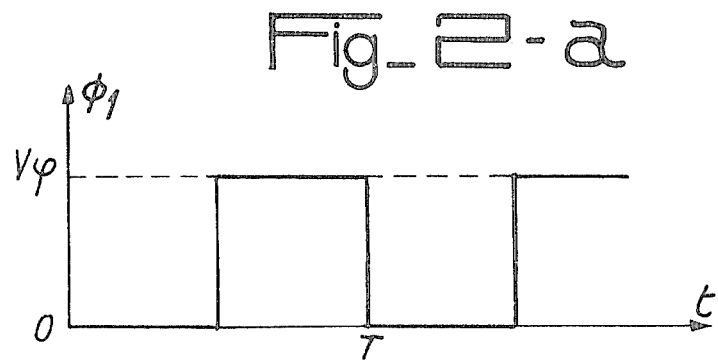
Fig_2-a
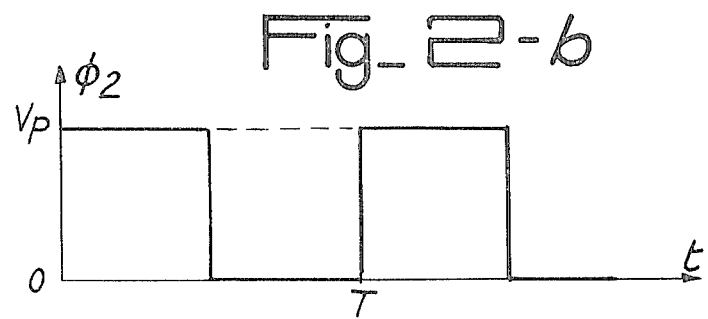
Fig_2-b

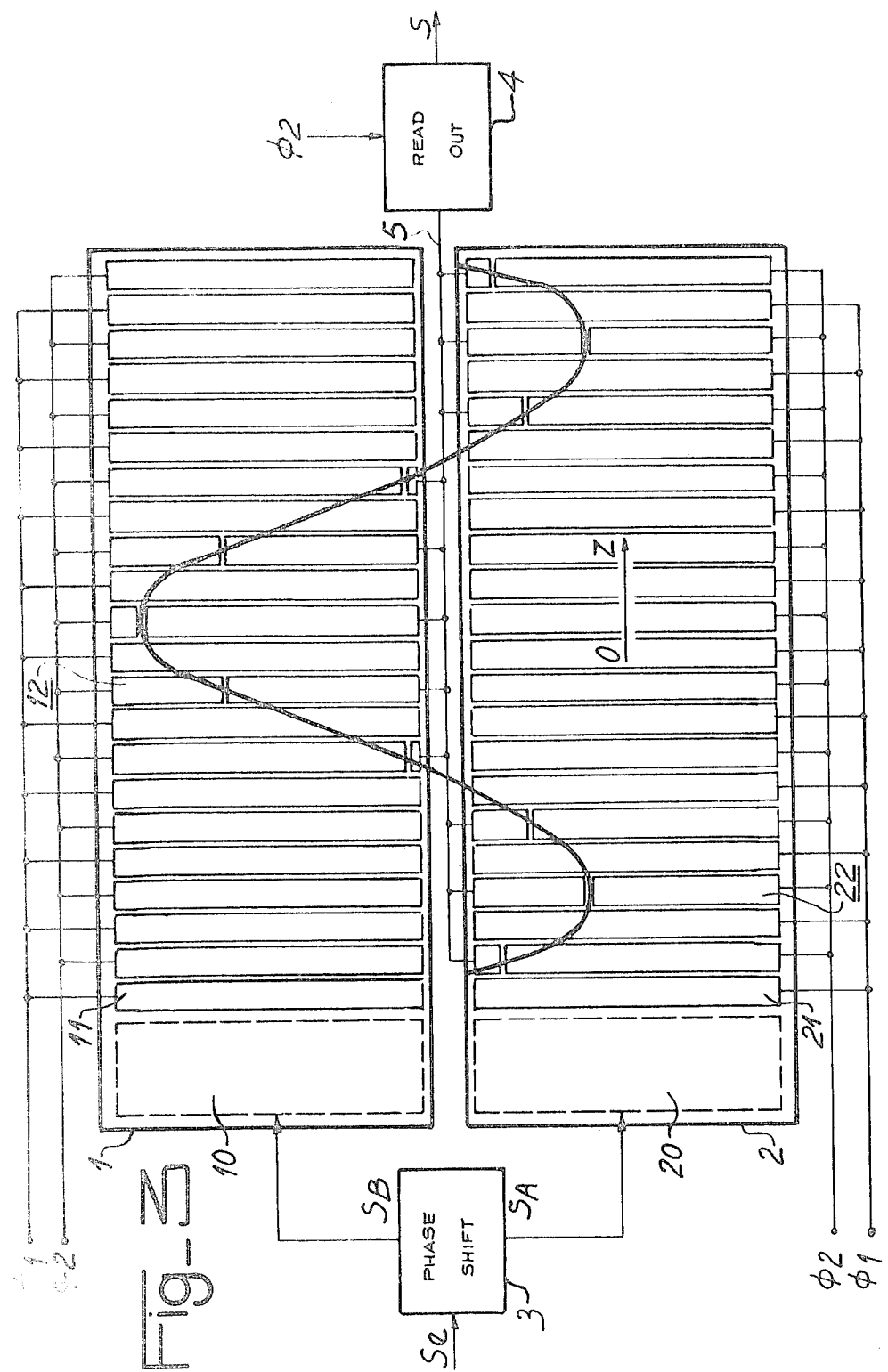

SEMICONDUCTOR PHASE SHIFT DEVICE FOR A CHARGE TRANSFER FILTER

The present invention relates to a phase shift circuit incorporating integrable semi-conductor elements, particularly designed for a filter, using charge transfer in a semi-conductor, in which the preceding phase shift circuit may form an input stage.

It may be remembered that a transversal charge transfer filter is formed by a semi-conductor substrate covered with an insulator on which the electrodes are arranged. These last, by the periodical applicaion of given potentials, ensure the transfer of packets of electric charges which represent the signal to be processed. In particular, filters of this type have been produced containing two separate channels in which the packets of charges which are transferred represent signals in phase opposition. Such an arrangement, which enables the filter output phase to be simplified, was described in French Pat. No. 2,397,756.

Such a filter requires a phase shift device which, when fitted at the filter input, supplies the input signal to two channels with a relative phase shift of 180°. This phase shift circuit must then have the following characteristics:

it must be made of semi-conductor elements which, if required, are integrable on the same semi-conductor substrate as the filter using it;

it must deliver signals of a given length which are able to be applied to the input diodes of the channels forming the filter;

it must deliver signal containing a common, adjustable, D.C. component;

it must allow the amplitude of one of the signals to be adjusted with respect to the other;

it must supply signals of high amplitude (about 2 Volts) with little distortion.

It is an object of the present invention to provide a device satisfying these various requirements.

According to the present invention, there is provided a semi-conductor phase shift device for generating two signals opposite in phase, comprising:

a sampling stage receiving an input signal ($S_e$) for the device and containing two MOS type transistors which operate in phase opposition, said sampling stage supplying a signal $S_{ECH}$ which, during one of said phases, is identical to the input signal ($S_e$) and, during the other of said phases, is a constant voltage $V_{REF}$;

a first MOS type transistor which receives signal $S_{ECH}$ on its gate and delivers, at its drain and source respectively, two signals $S_1$ and $S_2$ which are opposite in phase and represent in each case signal $S_{ECH}$;

capacitive coupling means, which receive signals $S_1$ and $S_2$ and transmit only the non-continuous components;

polarizing means containing MOS type transistors, which supply an adjustable D.C. component to signals $S_1$ and $S_2$.

For a better understanding of the invention and to show how it can be carried into effect, reference will be made to the description which follows and the drawings attached which show:

in FIG. 1, a schematic diagram of an embodiment of a phase shift device in acordance with the invention, in FIG. 2, diagrams of signals which can be used in the preceding device, in FIG. 3, a schematic diagram of a charge transfer filter comprising a phase shift device in accordance with the invention.

In these various figures, the same references concern the same elements.

In FIG. 1, a first series of MOS type transistors, two in number, $T_o$ and $T_o'$, is shown. These two transistors are used as switches operating in phase opposition and controlled respectively by two signals $\phi_1$ and $\phi_2$, which are shown as an example in FIG. 2.

Signal $\phi_1$ (FIG. 2a) is a roughly squarewave signal of period T, whose amplitude varies between 0 and $V_\phi$. Signal $\phi_2$ (FIG. 2 b) is a signal, which is preferably identical to $\phi_1$ but shifted in phase by $\pi$ with respect to the latter.

Transistor $T_o$ is connected between the device input and a point E and receives signal $\phi_1$ on its gate. Transistor $T_o'$ is connected between this same point E and an external polarizing source $V_{REF}$ and receives signal $\phi_2$ on its gate. Voltage $V_{REF}$ is chosen roughly equal to the mean value of the input signal ($S_e$) received by the device, a mean value which may be taken as the reference potential (ground) for the device.

In operation, transistor $T_o$ allows signal $S_e$ to pass to point E only during a half period of $\phi_1$, the half period which is called "active", i.e. during which the transistor is conducting ($\phi_1 = V_\phi$ for example), while $T_o'$ fixes the potential of this point at $V_{REF}$ during the next half period (the active phase of $\phi_2$). Hence the assembly $T_o$-$T_o'$ forms a sampling stage and the signal it supplies at E is called $S_{ECH}$.

Signal $S_{ECH}$ is applied to the gate of an MOS type transistor $T_1$, whose source (point B) is connected to an external polarizing source, which is negative ($-V_{SS}$) for example, through a resistor R. Its drain (point A) is connected to an external polarizing source, which is positive ($V_{DD}$), through a resistor of the same value R. Series connected with this latter resistor can be inserted a variable auxiliary resistor r, whose function is given hereinafter.

As is known, when signal $S_{ECH}$ is applied to the gate of transistor $T_1$, a signal $S_2$ is obtained at B, which is signal $S_{ECH}$ plus a given D.C. component, and a signal $S_1$ at A, which is 180° out of phase which respect to $S_2$ and contains a D.C. component different from that of $S_2$.

In order to get rid of these various D.C. components and replace them with other prearranged ones, a capacitive coupling is fitted between phase shift transistor $T_1$ and a polarizing device formed of MOS transistors.

Point A is therefore connected to a capacitor C whose other terminal is marked $A_1$. Point $A_1$ is connected to the source of an MOS transistor $T_2$ on the one hand and to the gate of an MOS transistor $T_4$ on the other. The drain of transistor $T_2$ is held at a D.C. potential $V_P$ and that of transisitor $T_4$ at a high polarizing voltage, $+V_{DD}$ for example. The gate of $T_2$ is controlled by signal $\phi_2$. The source of transistor $T_4$ (point $A_s$) is connected to both the drain and the gate of an MOS transistor $T_5$ and forms one of the two outputs of the device. The source of transistor $T_5$ is connected to a negative polarizing voltage ($-V_{SS}$) for example.

The circuit from point B is symmetrical with respect to the preceding one: B is connected to a second capacitor of the same value C as the previous one whose other terminal is marked $B_1$. The source of an MOS transistor $T_3$ is connected to point $B_1$ while its drain and gate are connected to the drain and gate of $T_2$ respectively. The gate of an MOS transistor $T_7$ is also connected to point $B_1$ while its drain is held at a polarizing voltage, $+V_{DD}$ for example. The source of $T_7$ (point $B_s$) forms the second output of the device which is connected to both the drain and gate of an MOS transistor $T_6$ whose source is connected to that of $T_5$.

The operation is in two steps:

in the active phase of signal $\phi_2$ ($\phi_2=V_\phi$), $S_{ECH}=-V_{REF}$ is on the gate of transistor $T_1$ while transistors $T_2$ and $T_3$ precharge the two capacitors C to voltage $V_P$;

in the active phase of signal $\phi_1$ ($\phi_1=V_\phi$), $S_{ECH}=S_e$ is on the gate of transistor $T_1$ and, at A and B, signals ($S_1$ and $S_2$) representing $S_e$ with different D.C. components. Due to the preceding precharge, the latter are also found at $A_1$ and $B_1$ with the same D.C. component $V_P$.

This assembly operates with very low values for capacitors C (10 pF for example) which are then integrable over a small surface with the rest of the device in classical MOS technology.

Transistors $T_4$ and $T_5$ on the one hand and $T_6$ and $T_7$ on the other form follower stages which transmit to outputs $A_s$ and $B_s$ the voltages $A_1$ and $B_1$ respectively with a shift equal to their threshold voltage, which is assumed to be the same for both transistors.

Hence, signals $S_A$ and $S_B$ are obtained at $A_s$ and $B_s$ 180° out of phase one with respect to the other as were signals $S_1$ and $S_2$ but with the same D. C. component which is a function of $V_P$ in particular. The level of this D.C. component can therefore be easily adjusted by changing the value of $V_P$.

Finally, the insertion of low value, variable auxiliary resistors in series with resistors R (or with one of them only as illustrated in FIG. 1 by the resistor r), enables the levels of the signal amplitudes to be adjusted to different values for the two channels, i.e. the relative gain to be adjusted.

FIG. 3 is the schematic diagram seen from above of a charge transfer filter using the technique called the "Charge coupled device" or CCD with two channels, comprising a phase shift device in accordance with the invention.

Such a filter is described in U.S. patent application Ser. No. 923 286 for the "Compagnie Européenne de Télétransmission" for example.

As is classical for charge transfer devices, it consists of a semi-conductor substrate covered with an insulating layer on which electrodes are arranged crosswise with respect to the direction of propagation OZ of charges in the semi-conductor. This filter contains two channels, 1 and 2, which are electrically insulated and roughly parallel.

Channels 1 and 2 receive signals $S_B$ and $S_A$ which are opposite in phase and obtained from input signal $S_e$ by the phase shift device described in FIG. 1 and shown schematically in FIG. 3 by a block 3. Phase shift device 3 is made for preference by integrated MOS technology on the same semi-conductor substrate as the filter properly speaking.

Each of channels 1 and 2 contains:

a stage (10 and 20 respectively) for injecting charges into the semi-conductor; it converts the input signal ($S_B$ and $S_A$ respectively) into a packet of charges which represent it; it may be formed, for example, for each channel, by an injection diode which receives the input signal ($S_A$ or $S_B$) and three electrodes which are normal to OZ, the first and third of these being held at the constant voltage $V_{DD}$ defined above while the middle electrode is connected to a periodic pulse signal, which allows the injection of the previously sampled input signal during the active phase of signal $\phi_1$;

an assembly of electrodes, called transfer electrodes, (11 for channel 1 and 21 for channel 2), which are connected to a roughly square wave voltage of period T, equal to $\phi_1$ for example;

an other assembly of electrodes, called weighting electrodes, (12 for channel 1 and 22 for channel 2), each of which is cut into two parts and that alternate with the transfer electrodes (11 and 21). They are connected to a second voltage of the same form as $\phi_1$ but 180° out of phase with it ($\phi_2$ for example).

The lower and upper parts respectively of electrodes 12 and 22 in channels 1 and 2 form the useful parts of the filter and correspond to its positive and negative weighting coefficients respectively. These useful parts are connected, through the same connection 5, to the same device 4 which ensures the application of signal $\phi_2$ to these useful parts on the one hand and the reading of the quantities of charge (output signal S) present under these electrodes on the other;

Finally, each of channels 1 and 2 can have, at the end opposite the injection stage, a diode (not shown), which is made in the semi-conductor substrate and whose function is to collect the charges which have passed through the device to eliminate them.

In operation, channels 1 and 2 receive signals $S_B$ and $S_A$, which are 180° out of phase one with respect to the other. In accordance with a mechanism, which is classical in this type of filter, a packet of charges representing a sample of the input signal ($S_B$ or $S_A$) is transferred from one electrode to the other at each half period of signals $\phi_1$ and $\phi_2$ in phase in both channels. If both channels have identical characteristics, a direct weighting of signal $S_e$ is obtained, which is represented by signal S, by positive (channel 1) or negative (channel 2) coefficients proportional to the widths (i.e. normally to OZ) of the useful parts of the weighting electrodes (12 and 22).

If the channels have not got identical characteristics, which is the general case in practice, balancing can be done at the level of phase shift device 3 and, more precisely, at the level of the auxiliary resistor (r) mentioned above, which is placed in series with one of resistors R in FIG. 1.

Finally, as was indicated above, it is possible to adjust voltage $V_P$ to obtain an optimum value of the D.C. component in signals $S_A$ and $S_B$ as a function of the characteristics of injection stages 10 and 20.

As a non-limiting example, this device has been made with polarizing voltages whose size is about: 12 Volts for $V_{DD}$, zero or $-5$ Volts for $-V_{SS}$, 2 or 3 Volts for $V_P$; the amplitude of signals $S_A$ and $S_B$ injected into channels 2 and 1 is then of the order of one or two Volts.

What is claimed is:

1. A semi-conductor phase shift device for generating two signals opposite in phase, comprising:

a sampling stage receiving an input signal ($S_e$) for the device and containing two MOS type transistors which operate in phase opposition, said sampling stage supplying a signal $S_{ECH}$ which, during one of said phases, is identical to the input signal ($S_e$) and, during the other of said phases, is a constant voltage $V_{REF}$;

a first MOS type transistor which receives signal $S_{ECH}$ on its gate and delivers, at its drain and source respectively, two signals $S_1$ and $S_2$ which are opposite in phase and represent in each case signal $S_{ECH}$;

capacitive coupling means, which receive signals $S_1$ and $S_2$ and transmit only the non-continuous components;

polarizing means containing MOS type transistors, which supply an adjustable D.C. component to signals $S_1$ and $S_2$.

2. A device as in claim 1, wherein said two transistors in the sampling stage have a common point (E) at which said signal $S_{ECH}$ is available, the first of said two transistors transmitting said input signal $(S_e)$ during one of the phases, called the active phase, of a first periodic signal $(\phi_1)$ received on its gate while the second of said two transistor transmits said voltage $V_{REF}$ during the other phase of said first periodic signal $(\phi_1)$.

3. A device as in claim 1, wherein said voltage $V_{REF}$ is roughly equal to the mean value of said input signal $(S_e)$.

4. A device as in claim 1, wherein said capacitive coupling means comprise two capacitors of substantially the same value, said capacitors being connected by one of their terminals to the drain (A) and source (B) respectively of said first transistor and by their other terminal ($A_1$ and $B_1$) to said polarizing means.

5. A device as in claim 2, wherein said polarizing means comprise two channels, which are formed symmetrically and connected to capacitors respectively, the input point ($A_1$) of the first of said two channels being connected to the source of a second MOS type transistor an the gate of a third MOS type transistor, the source ($A_s$) of the latter forming one of the two outputs for said phase shift device; the input point ($B_1$) of the second of said two channels being connected to the source of a fourth MOS type transistor and to the gate of a fifth MOS type transistor, the source ($B_s$) of the latter forming the second of the two outputs of said phase-shift device; the gates of the second and fourth transistors being connected to a second periodic signal $(\phi_2)$, which is opposite in phase to said first periodic signal $(\phi_1)$, the drains of the same two transistors being connected to a first polarizing voltage ($V_p$) and ensuring during the second phase the precharging of the two capacitors (C), the adjustment of said first polarizing voltage ($V_p$) ensuring that of the D.C. component of the signals available at said two outputs.

6. A device as in claim 1, further comprising two identical resistors, which are connected, the first, between the drain of said first transistor and a second polarizing voltage ($V_{DD}$) and, the second resistor, between the source of said first transistor and a third polarizing voltage ($-V_{SS}$).

7. A device as in claim 5, wherein said polarizing means further comprise a sixth and seventh MOS type transistor, whose gate and drain are together connected to the source of said third and fifth transistors respectively, the drains of these last two transistors being held at a second polarizing voltage ($V_{DD}$) and the sources of said sixth and seventh transistors being held at a third polarizing voltage ($-V_{SS}$).

8. A device as in claim 6, further comprising at least one variable resistor, of low value compared with that of said two identical resistors, said variable resistor being connected in series with one of said two resistors and enabling the relative gain of said signals $S_1$ and $S_2$ to be adjusted.

9. A charge transfer filter comprising a phase shift device as in claim 1 receiving the input signal of the filter and generating two signals opposite in phase, a semi-conductor substrate, an insulating layer deposited on said substrate and electrodes deposited on said insulating layer which, when given potentials are applied, ensure the transfer of charges in the substrate, said substrate comprising two electrically insulated channels, said channels receiving respectively said two signals opposite in phase, each of said channels comprising:

injection means for generating packets of charges representing the signal received by the channel, a first set of electrodes called weighting electrodes, giving a weighting coefficient to the signal represented by said packets of charges moving in the channel, said weighting electrodes being split this coefficient is not zero, the two parts being connected to a first periodic voltage $(\phi_2)$, the division into two parts giving a positive weighting coefficient in the first channel and a negative weighting coefficient in the second channel, a second set of electrodes called transfer electrodes, which are not split, alternate with the weighting electrodes and are connected to a second periodic voltage $(\phi_1)$ with the same period but opposite in phase to the first voltage $(\phi_2)$, the weighting and transfer electrodes ensuring the transfer of packets of charges in phase in said two channels, one part of the split electrodes in said two channels being connected together to means for reading the quantities of charge existing under these parts of electrodes, said reading means supplying the filter output signal.

10. A device as in claim 3, wherein said polarizing means further comprise two pairs of MOS type transistors, one of said pairs of transistors ($T_5$, $T_6$) whose gate and drain are together connected to the source of said other pair ($T_4$, $T_7$) of transistors respectively, the drains of these last two transistors, ($T_4$, $T_7$) being held at a second polarizing voltage ($V_{DD}$) and the sources of said transistors ($T_5$, $T_6$) being held at a third polarizing voltage ($-V_{SS}$).

* * * * *